United States Patent [19]

Bachur et al.

[11] 4,024,428

[45] May 17, 1977

[54] RADIATION-SENSITIVE CONTROL CIRCUIT FOR DRIVING LAMP AT VARIOUS POWER LEVELS

[75] Inventors: Gerald Bachur, San Jose; George E. Richardson, Santa Clara, both of Calif.

[73] Assignee: Optical Associates, Incorporated, Santa Clara, Calif.

[22] Filed: May 19, 1975

[21] Appl. No.: 578,915

[52] U.S. Cl. .............................. 315/151; 315/158; 355/69

[51] Int. Cl.² ................. H05B 41/38; G03B 27/78

[58] Field of Search .......... 315/156, 151, 149, 158, 315/157, 159

[56] References Cited

UNITED STATES PATENTS

| | | |
|---|---|---|
| 2,298,344 | 10/1942 | Burnham ...................... 315/151 X |
| 3,366,835 | 1/1968 | Morris ........................... 315/151 X |
| 3,431,427 | 3/1969 | Pahl ............................... 315/151 X |
| 3,456,155 | 7/1969 | Buchanan ..................... 313/158 X |
| 3,483,428 | 12/1969 | Plante ................................ 315/151 |
| 3,681,654 | 8/1972 | Quinn ................................ 315/151 |
| 3,726,197 | 4/1973 | Hasegawa et al. ............. 315/156 X |

Primary Examiner—Robert Segal
Attorney, Agent, or Firm—Fitch, Even, Tabin & Luedeka

[57] ABSTRACT

An exposure system is described employing a lamp and means for controlling the exposure time period during which light from the lamp at a preselected level is passed through a light path to an exposure plane. Light is detected in the light path and the brightness of the lamp is adjusted according to the sensed light to provide the preselected level of light output from the lamp during the exposure period. Also described is a method for operating such a system.

9 Claims, 5 Drawing Figures

RADIATION-SENSITIVE CONTROL CIRCUIT FOR DRIVING LAMP AT VARIOUS POWER LEVELS

This invention relates generally to exposure systems and, more particularly, to an improved exposure system which is of particular advantage in connection with short arc mercury lamps or the like.

In many industrial and laboratory processes, an exposure system is utilized to provide visible or invisible light in an exposure plane. Photolithographic processes and semiconductor manufacturing processes frequently employ exposures of this nature in which various types of exposure systems have been used.

More particularly, and by way of example, in the manufacture of certain types of semiconductor devices it is necessary to expose silicon wafers, which have been coated with a photo-resist material, to ultraviolet light energy. The exposure pattern is generally determined by a suitable mask and a short arc mercury lamp is used as the source of ultraviolet light energy. The exposure period, that is, the time that light from the lamp is directed to the exposure plane in which the wafer lies, is determined by the amount of light energy necessary to properly expose the photo-resist material.

A typical exposure system employs a lamp which is driven by a suitable power supply and means for directing light from the lamp through a light path to the exposure plane. A shutter located in the light path between the lamp and the exposure plane controls the exposure period. The lamp energy may be gathered by a parabolic type of reflector or the like and directed through the light path by one or more optical lenses to the exposure plane.

Prior art exposure systems have suffered from a number of disadvantages. Among these disadvantages is that such systems have often been unable to provide high uniformity of light intensity in the exposure plane. As a result, nonuniform exposure of the photo-resist results with a consequent reduction in the number of semiconductor devices of satisfactory quality which can be produced from a wafer.

Other disadvantages present in many prior art exposure systems result from the fact that short arc mercury lamps and the like vary in brightness with age. Also certain portions of a given lamp may emit greater light energy than other portions. Operation of such lamps at different power levels over relatively long periods of time can result in a substantial reduction in the life of a lamp. Deterioration in lamp output requires compensation in the exposure period so that the total energy applied to the exposure plane is consistent for each exposure. Such adjustments may, however, be exceedingly difficult to achieve. Reduction in lamp life increases the down time of the exposure system. Replacement and readjustment of lamps and power output levels is costly and time-consuming, reducing product throughput.

It is an object of the present invention to provide an improved exposure system which is particularly useful in connection with short arc mercury lamps and the like.

Another object of the invention is to provide an exposure system which achieves high uniformity of light intensity over the exposed area in the exposure plane.

Another object of the invention is to provide an exposure system in which the useful life of the lamp is substantially increased.

A further object of the invention is to provide an exposure system which provides significant advantages over the prior art and which is low in cost and readily manufactured.

Other objects of the invention will become apparent to those skilled in the art from the following description, taken in connection with the accompanying drawings wherein.

Figure 1:
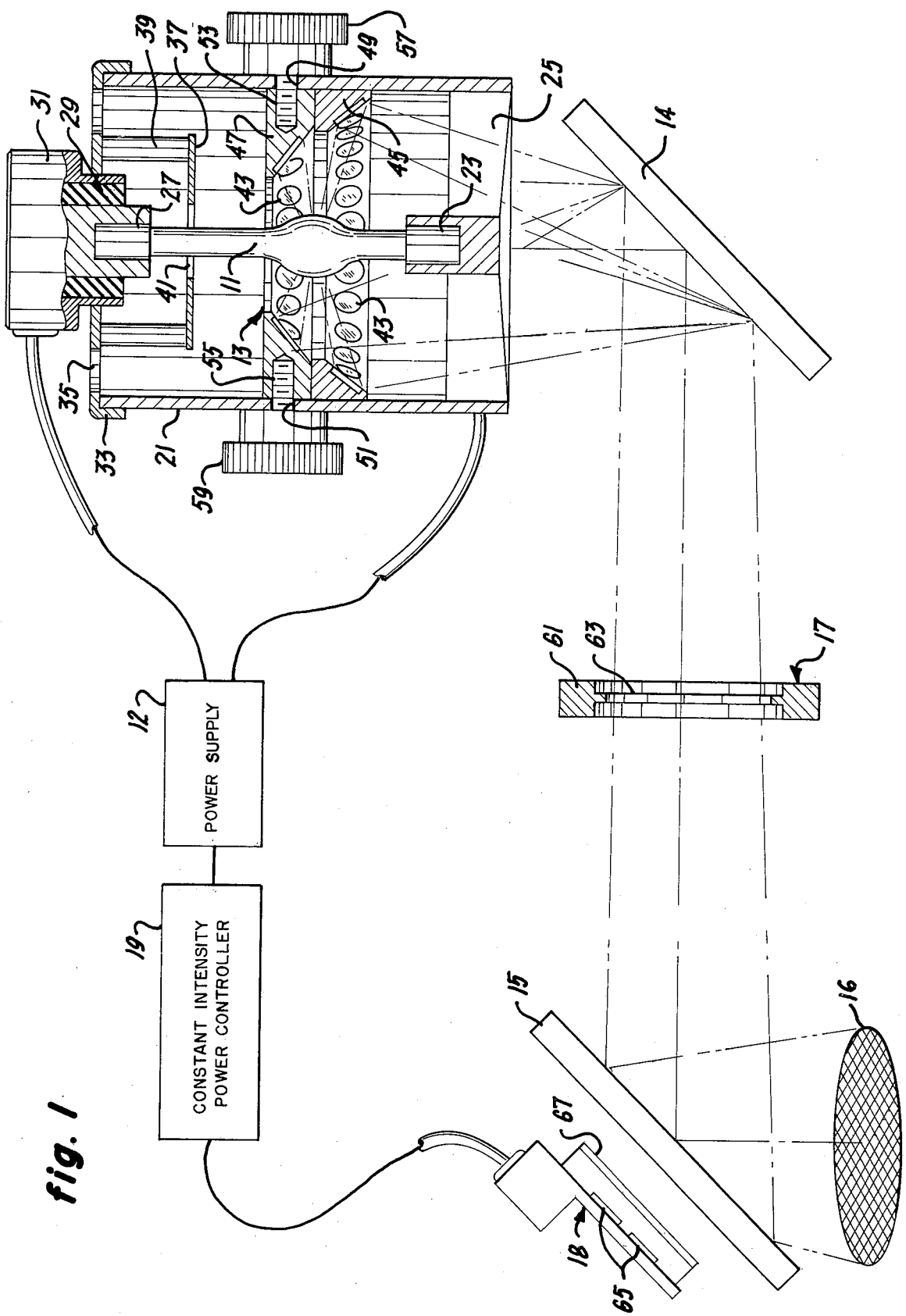
FIG. 1 is a schematic diagram of an exposure system constructed in accordance with the invention.

Very generally, the exposure system of the invention comprises a lamp 11 and a power supply 12 for driving the lamp at a level which optimizes the life of the lamp. Means 13, 14 and 15 direct light from the lamp through a light path to an exposure plane 16. Exposure means 17 control the exposure period during which light at a preselected level from the lamp reaches the exposure plane. Light detector means 18 are provided in the light path coordinated with the exposure means 17 for detecting the light intensity during the exposure period. Control means 19 are connected to the power supply 12 and are responsive to the light detector means 18 for adjusting the power supply to provide a preselected level of light output from the lamp 11 during the exposure period.

Referring now more particularly to FIG. 1, the short arc mercury lamp 11 is mounted within a generally cylindrical housing 21, being supported at its anode end 23 by a spider 25 extending inwardly from the housing 21. The cathode end 27 of the lamp 11 is secured in a lamp mounting base 29 which, in turn, is supported in a lamp base mounting fixture 31. The housing 21 is closed by a cover plate 33 which also centers and supports the lamp base mounting fixture 31, and which is provided with vents 35 therein to assist cooler running of the lamp 11. A light shield 37 is mounted to the cover 33 by mounting posts 39 and is provided with a central opening 41 through which the lamp passes. The light shield minimizes the back throw of light through the vents 35 in the rear of the housing.

The means which direct light from the lamp to the exposure plane include a plurality of reflectors 43 supported within the housing 21 arrayed about the lamp 11. More particularly, the reflectors 43 in the illustrated embodiment comprise a plurality of planar disk shaped mirrors which are supported on one or more reflector support means or collection rings 45 and 47 in FIG. 1. The supports or collection rings 45 and 47 support the mirrors at angles calculated to reflect the arc within the lamp 11 and to direct its energy on to the desired area in the exposure plane 16, as will be explained. The mirrors 43 may be of any suitable diameter, but preferably are at least about 5 millimeters in diameter. It has been found that at least 14 of the reflectors should be provided for satisfactory operation. The reflectors are evenly spaced in an annular array about each of the collection rings 45 and 47. The choices of specific diameters and angles of mounting of the reflectors 43 depend upon the particular requirements of the application in which the exposure system is used.

In the illustrated embodiment, two collection rings with their associated reflectors are shown. It is to be understood, however, that any number of collection rings and associated reflectors may be utilized. The collection rings 45 and 47 are secured together by suitable means, not shown, such as screws, and are supported from the housing 21. More particularly, the housing 21 is provided with diametrically opposite slots 49 and 51 which are suitably angled to provide for axial adjustment of the collection rings 45 and 47. For example, the slots 49 and 51 may describe portions of a helix having an axis lying on the axis of the housing 21 and the lamp 11. Threaded shafts 53 and 55 pass through the openings 49 and 51, respectively, and are screwed into one of the attached collecting rings 45 and 47. Suitable clamping knobs 57 and 59 are mounted on the threaded shafts 53 and 55, respectively, to enable the collection rings to be clamped securely to the housing 21. Loosening of the knobs 57 and 59 enables adjustment of the collection rings by suitable rotation in the slots 49 and 51, thereby moving the nested collection rings 45 and 47 axially within the housing 21.

If the collection rings 45 and 47 are moved upwardly or downwardly along the axis of the lamp 11 which they encircle, or if the mirror seating angles in the collection rings 45 and 47 are altered, the beam of energy which the reflectors direct can be varied in its convergence or divergence. Similarly, if a greater or lesser number of collection rings are provided, then a correspondingly larger or smaller number of mirrors is provided acting to gather energy. Thus, the energy output efficiency and the colimation characteristics of the system may be varied as desired. The circular plane on which the mirrors are mounted may be of selected diameters and angles such that each mirror is placed so that a maximum energy will be collected from the arc of the lamp and directed along the desired path toward the target.

The light energy emerging from the open lower end of the housing 21, in the illustrated embodiment, impinges upon a mirror 14. This light is then reflected through an angle of approximately 90° to a further mirror 15. Another change in the angle of the light path deflects the beam downwardly on to the exposure plane 16 in a suitable area indicated by the cross-hatching. Each image of the lamp arc projected on the exposure plane is enlarged to cover the desired area of exposure. By suitable adjustment of the reflectors 43 and their supports, the short arc within the lamp 11 may be presented in the exposure plane 16 as a plurality of apparent images superimposed on each other with different orientations in such a manner that an extremely uniform area of illumination results in the exposure plane 16. The output energy is, therefore, extremely uniform and noncoherent due to the multiple source effect. This avoids standing waves or mutant rings which might otherwise be caused by unwanted particulate debris entering the light path. Such standing waves or mutant rings cause undesirable exposure defects. Deficiencies inherent in lens systems and parabolic reflector systems, because of their inability to present a multiplicity of apparent sources and thereby lack of uniformity, are avoided.

In the illustrated embodiment, the exposure means comprise shutter means positioned in between the mirror 14 and the mirror 15. Other types of exposure means may include various optical, mechanical, or electrical devices, or combinations thereof, which control the amount of time light at a preselected level is directed to the exposure plane. The shutter means comprise a suitable shutter support 61 and the shutter 63 itself. A suitable drive mechanism, not illustrated, is employed to open and close the shutter 63, thus passing or interrupting, as desired, the light from the lamp 11 to the exposure plane 16. The time during which the shutter 63 is open thereby governs the exposure period, and it may be varied in accordance with the time of exposure necessary to the particular process in connection with which the system is employed.

For the purpose of controlling the intensity of the light reaching the exposure plane 16, the system of the invention employs the sensor or light detector means 18 coordinated with the exposure means. In the illustrated embodiment, the light detector means 18 are in the light path on the opposite side of the shutter means 17 from the lamp 11. Thus, the light detector operates when the shutter opens. Although any suitable position for the light detector is satisfactory, the illustrated embodiment of the invention employs a mirror 15 which is transparent to a small percentage (for example, 5-15 percent) of the light impinging upon it. Thus, although the detector means 18 are positioned behind the mirror 15, the detector means are still in the light path because of the transparency of mirror 15. The light detector means 18 provide information directly related to the light intensity when the shutter 63 is open therefor during the exposure period. Alternatively, the mirror may be oriented to pass most of the light to the exposure plane and reflect a small percentage to the light sensor.

The information regarding light intensity provided by the light detector means 18 is used to control the light output from the lamp during the exposure period. This is done by feeding the information to the control circuit 19 which is connected to the power supply 12 for the lamp 11. The control circuit, as will be explained, is responsive to the light detector means 18 for adjusting the power supply 12 to provide a preselected level of light output from the lamp 11 during the exposure period. At all other times during which the exposure system of the invention is being operated, the lamp 11 may be driven by the power supply 12 at a level which optimizes the life of the lamp. The control circuit 19 operates to cause the power supply 12 to drive the lamp up or down from this optimal level or idle level, as is necessary to achieve the preselected desired level of light output from the lamp during the exposure period. It is preferred that the response of the control circuit to the light detector is sufficient so as to ensure that the light output of the lamp 11 is at the desired preselected level for at least about 95 percent of the exposure period. The circuitry described below is capable of achieving a 99 percent figure. This may require a response time of less than about 10 milliseconds, and possibly less than about 5 milliseconds.

The light detector means 18 employ one or more stable silicon photodetectors 65 and an optical filter system 67, for example, a subtraction filter. The photodetectors and filter act together and are selected to provide a spectral response which is related to the spectral response of the photosensitive material being exposed in the exposure plane. By properly selecting this spectral response, the sensor may track the same spectral region which affects the photo-resist material or the like, ensuring that the system will provide maximum exposure accuracy.

The exposure level desired is preselected, by suitable adjustments in the circuitry described below, so that the circuitry will drive the lamp 11 to the energy level needed for a proper exposure. Typically, this preselected level is based upon the desired milliwatts per square centimeter at a specific wave length band for the sensitivity of the photosensitive material being used. When the shutter opens, the light detector means 18 receive some of the energy in the light path to the exposure plane and the control circuit 19 relates this to the preselected level. The power supply 12 is then adjusted to cause the lamp to be driven at a higher or lower level than the idle level as required for proper exposure. This ideal exposure level is maintained until the shutter closes and the exposure period is terminated. The lamp 11 then is permitted to return to the optimum or idle level. In this way, the useful life of a typical short arc mercury lamp in the system of the invention is significantly longer than that provided by prior art exposure systems. For example, a standard 250-watt lamp when operated conventionally at 235 watts will give a typical life of approximately 200 hours, whereas with the system of the invention, the life of comparable lamps typically exceeds 700 hours.

Figure 2:
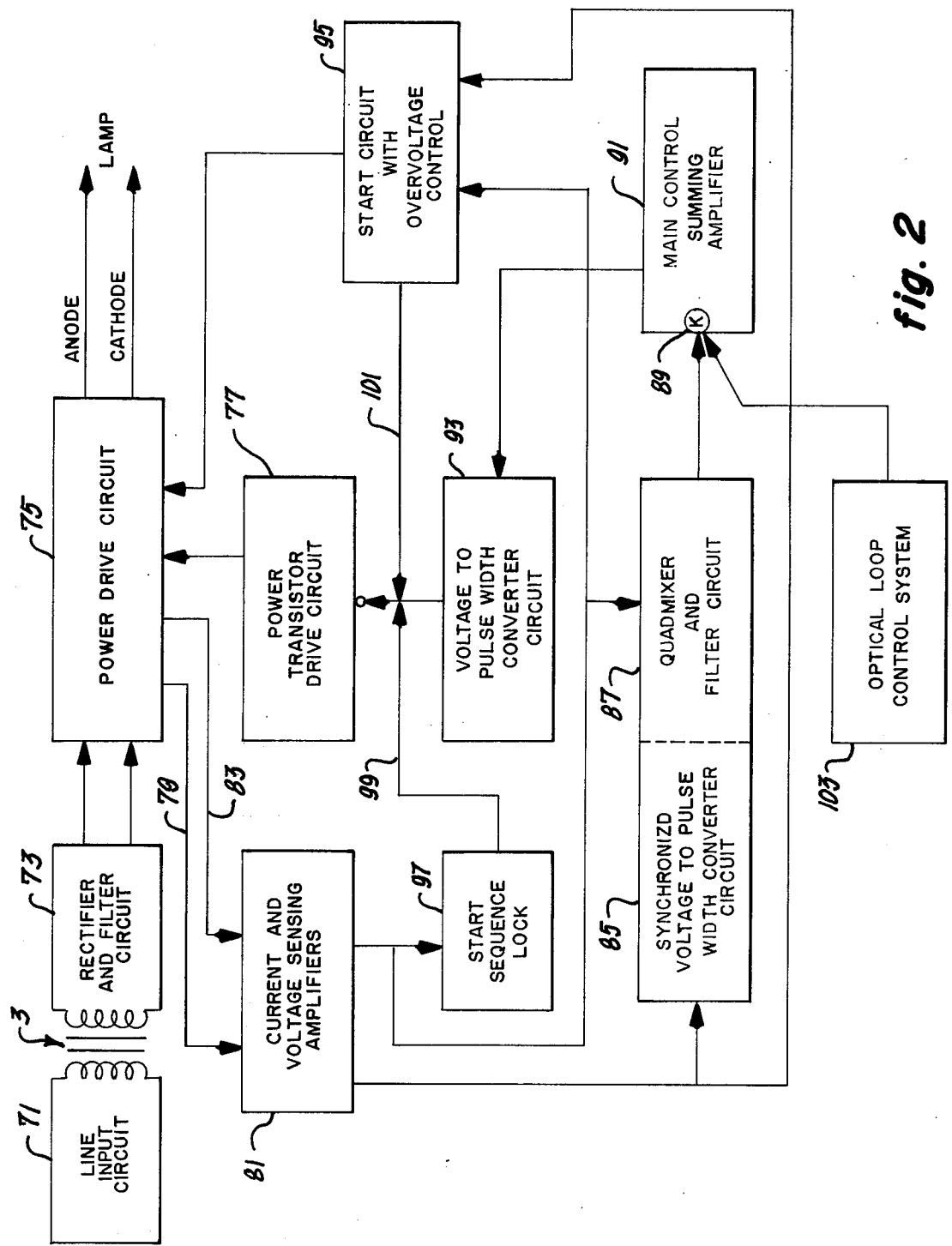
FIG. 2 is a block diagram of the constant intensity power controller, power supply and associated circuits used in connection with the exposure system of FIG. 1.

Referring now more particularly to FIG. 2, a block diagram of the power control 19 of FIG. 1 is shown, together with the lamp power supply 12 of FIG. 1. Power from an ordinary 117-volt line is applied through a line input circuit 71 of conventional design incorporating the usual fuse and switch (not shown). A transformer 73 couples the line input circuit 71 to a rectifier and filter circuit 73, also of conventional design. The circuit 73 employs suitable capacitors and diodes and provides power to the power drive circuit 75 described in detail below. Power may also be derived from the rectifier and filter circuit 73 for operating the remainder of the circuit elements described below.

The power drive circuit 75 may be of any suitable type and may, for example, employ a power transistor (not shown) series connected in the anode-cathode circuit of the lamp 11 for supplying operating current to the lamp.

For the purposes of operating the unillustrated power transistor in the power drive circuit 75, a suitable power transistor drive circuit 77 is employed. The power transistor drive circuit may be of any conventional design such as, for example, a J-K flip-flop oscillator. In such a circuit, an oscillator is used to drive, through a J-K flip-flop circuit, the base drive transistors for the power transistor. The drive frequency may, for example, be about twenty KHz.

For the purpose of providing voltage and current, both the voltage across the lamp and the anode to cathode current in the lamp are sensed. This may be done by utilizing an appropriate series resistor in the power drive circuit 75 as is well known in the art, and by utilizing an appropriate diode or resistor connected in parallel with the lamp 11 for voltage sensing, also as is well known in the art. A signal representative of voltage is applied through a line 79 to a current and voltage sensing amplifier circuit 81. Similarly, the signal representative of current is applied through a line 83 to the current and voltage sensing amplifier circuit 81.

The current and voltage sensing amplifier circuit 81 may be of any suitable conventional design for amplifying the signals representative of the voltage and of the current present in the lines 79 and 83. The amplified signal representative of voltage is applied from the amplifier circuit 81 to a synchronized voltage to pulse width converter circuit 85 which is combined with a quadmixer and filter circuit 87. The circuits 85 and 87 are described in detail below. The signal representative of current is applied from the circuit 81 directly to the quadmixer and filter circuit 87.

The circuit 85 is synchronized with the oscillator in the circuit 77 at, for example, about 20 KHz, and provides a signal in which the width of the output pulse is proportional to the voltage applied to the circuit 85. Thus, the larger the voltage across the lamp, the greater the width of the pulses produced by the circuit 85.

The quadmixer and filter circuit 87 combines the voltage related signal produced in the circuit 85 and the current signal from the circuit 81 to produce a signal in which the width of the signal is representative of the voltage and in which the amplitude of the signal is representative of the current. Suitable circuitry, explained below, operates to filter and buffer this signal and produce an output current at a point 89 in a main control summing amplifier 91. The signal at the point 89 drives the amplifier 91, which may be a suitable operational amplifier with the current summing junction 89 located therein.

The output signal from the main control summing amplifier 91 is applied to a voltage to pulse width converter circuit 93. This voltage to pulse width converter circuit is similar to the circuit employed in the synchronized voltage to pulse width converter circuit 85 which is described below. The voltage to pulse width converter circuit 93 operates to change the output of the amplifier 91 to a sawtooth form or ramp signal for driving the unillustrated J-K flip-flop in the drive circuit 77 to drive the base drive transistors in the power transistor drive circuit 77.

For the purpose of starting the lamp operation, a start circuit 95 is provided, described in greater detail below. When a start switch is closed, the start circuit 95 produces a series of pulses, which are coupled through a suitable pulse transformer to create a pulse of sufficient magnitude to break down the lamp. Typically, a 13-KV pulse will be sufficient. If the lamp starts, the current signal in the line 83 is applied through the amplifiers 81 to a start sequence lock circuit 97. The circuit 97 comprises a suitable comparator switch known in the art, and, upon receiving an input signal, provides an output signal to the J-K flip-flop in the circuit 77 which locks it on. The output of the amplifier 81 is also applied to stop any further pulsing of the start circuits 95. As will be explained, the start circuit 95 employs an indicator lamp which is energized in the event that the lamp does not start after a sequence of pulses of a predetermined number applied to the lamp 11.

The circuit 95 also employs an over voltage control, as will be described in detail below. When the voltage across the lamp exceeds a preset limit, as sensed through the circuit 81, a signal is applied through the line 101 to the power transistor drive circuit 77 to lock out the drive pulses and turn the power transistor in the circuit 75 off. At the same time, the lamp indicator described below is energized to indicate that the short arc mercury lamp 11 requires replacement.

The circuitry for the optical loop control system 103 is described in greater detail below. As previously mentioned, the light sensed by the sensor is converted to a suitable electrical signal and is applied to the power supply at the summing junction 89 in the main control summing amplifier 91. When the signal from the detector indicates an excessive light level, a suitable signal is produced and applied to the summing junction 89 to cause a reduction in power to the lamp. When the light level is too low, a signal is applied to the summing junction 89 to cause an increase in power to the lamp in accordance with the setting of the system.

Figure 3:
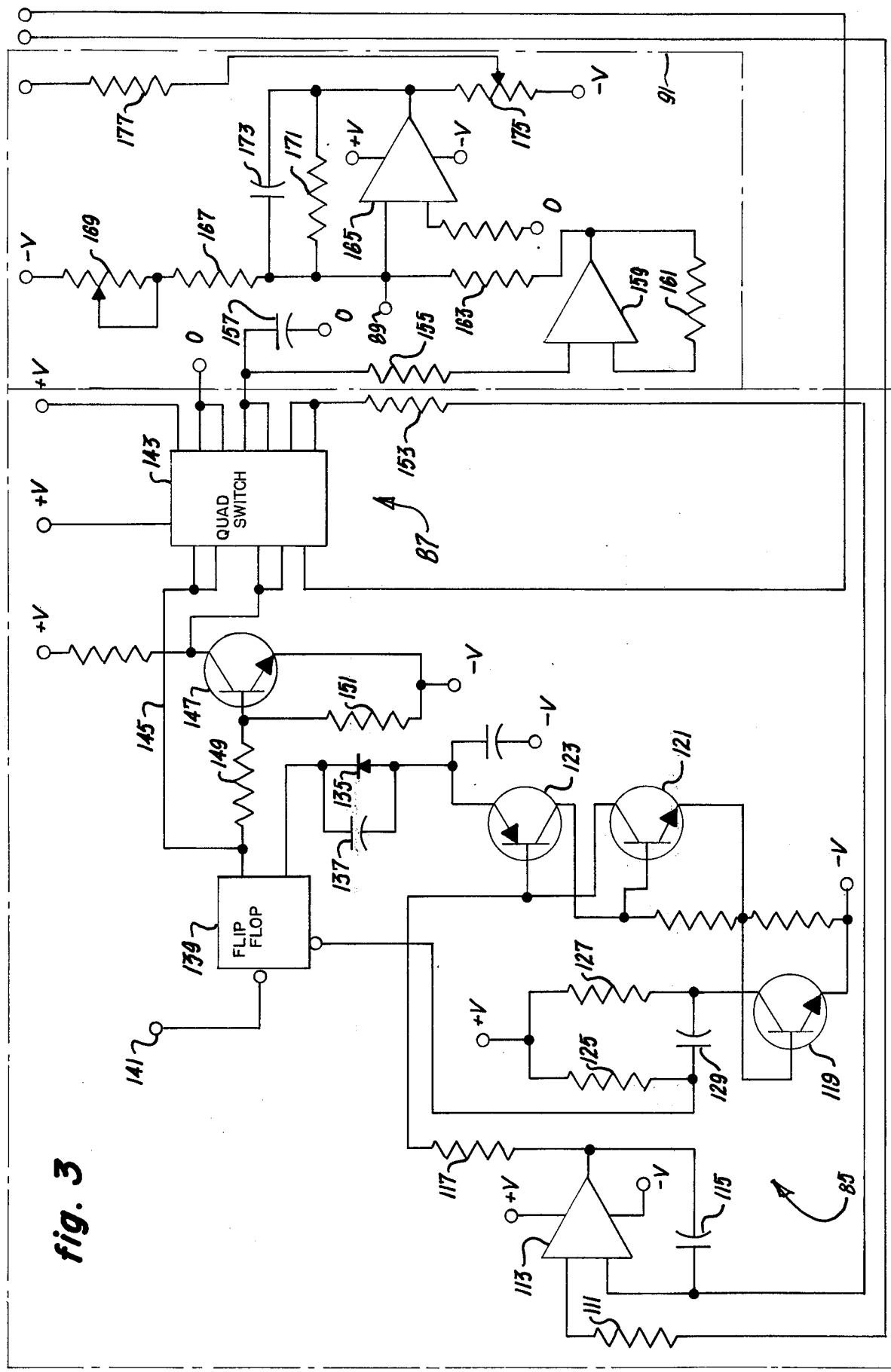
FIG. 3 is a schematic circuit diagram of synchronized voltage to pulse width converter circuit, quadmixer and filter circuit, and main control summing amplifier employed in the apparatus illustrated in FIG. 2.

Referring now to FIG. 3, the circuit diagram illustrated therein comprises the synchronized voltage to pulse width converter circuit 85 and the quadmixer and filter circuit 87, together with the main control summing amplifier 91. The voltage signal from the current and voltage sensing amplifier circuit 81 is applied through a resistor 111 to an amplifier 113. A feedback capacitor 115 is provided for the amplifier, and the output of the amplifier is applied through a resistor 117 to a circuit which includes three transistors 119, 121, and 123. Biasing resistors 125 and 127, together with a filter capacitor 129, are provided in the collector circuit of the NPN transistor 119. Two series resistors 131 and 133 provide bias for the base of the transistor 119 and the base of the transistor 121. The base of the transistor 121, which is an NPN transistor, is connected to the collector of the PNP transistor 123, and the base of the transistor 123 is connected to the collector of the transistor 121. The emitter of the transistor 123 is connected through a diode 135 with a parallel capacitor 137 to a J-K flip-flop 139. The resistor 125 is also connected to the J-K flip-flop to provide bias current thereto. A terminal 141 connects the J-K flip-flop 139 to the oscillator in the power transistor drive circuit 77 (FIG. 2) to synchronize the operation of the flip-flop with the aforesaid oscillator.

The result of the circuit comprising the transistors 119, 121, 123 and the J-K flip-flop 139 is a synchronized voltage to pulse width converter circuit. The voltage signal output representative of the lamp voltage applied from the current and voltage sensing amplifier circuit 81 (FIG. 2) controls the width of the pulse output of the J-K flip-flop 139.

The output of the J-K flip-flop 139 is applied to a quadswitch 143 through a direct connection 145 and through a transistor 147 having base resistors 149 and 151. Input to the quadswitch 143 is also applied through a series resistor 153 to the quadswitch 143 from the current signal amplifying section of the current and voltage sensing amplifier circuit 81 (FIG. 2). As is known in the art, the quadswitch 143 comprises a chip consisting of a plurality of field effect transistors. The output of the quadswitch 143, which is applied to a series resistor 155 having a filter capacitor 157, is a series of pulses in which the width represents the voltage across the lamp and in which the amplitude of the pulses represents the current through the lamp.

This series of pulses is provided through a buffer amplifier 159 having a feedback resistor 161, and through a series resistor 163 to the summing junction 89 to which the output from the optical loop control system 90 is also applied, as explained below.

The summing junction 89 represents the input to the summing amplifier 165. An operating power level is established through a resistor 167 and a potentiometer 169 which changes the voltage/current power signal from the quadswitch 143. A feedback resistor 171 and a filter capacitor 173 are provided across the amplifier 165, and the output of the amplifier is passed through a potentiometer 175 and a series resistor 177 to the voltage to pulse width converter circuit 93 (FIG. 2).

Figure 4:
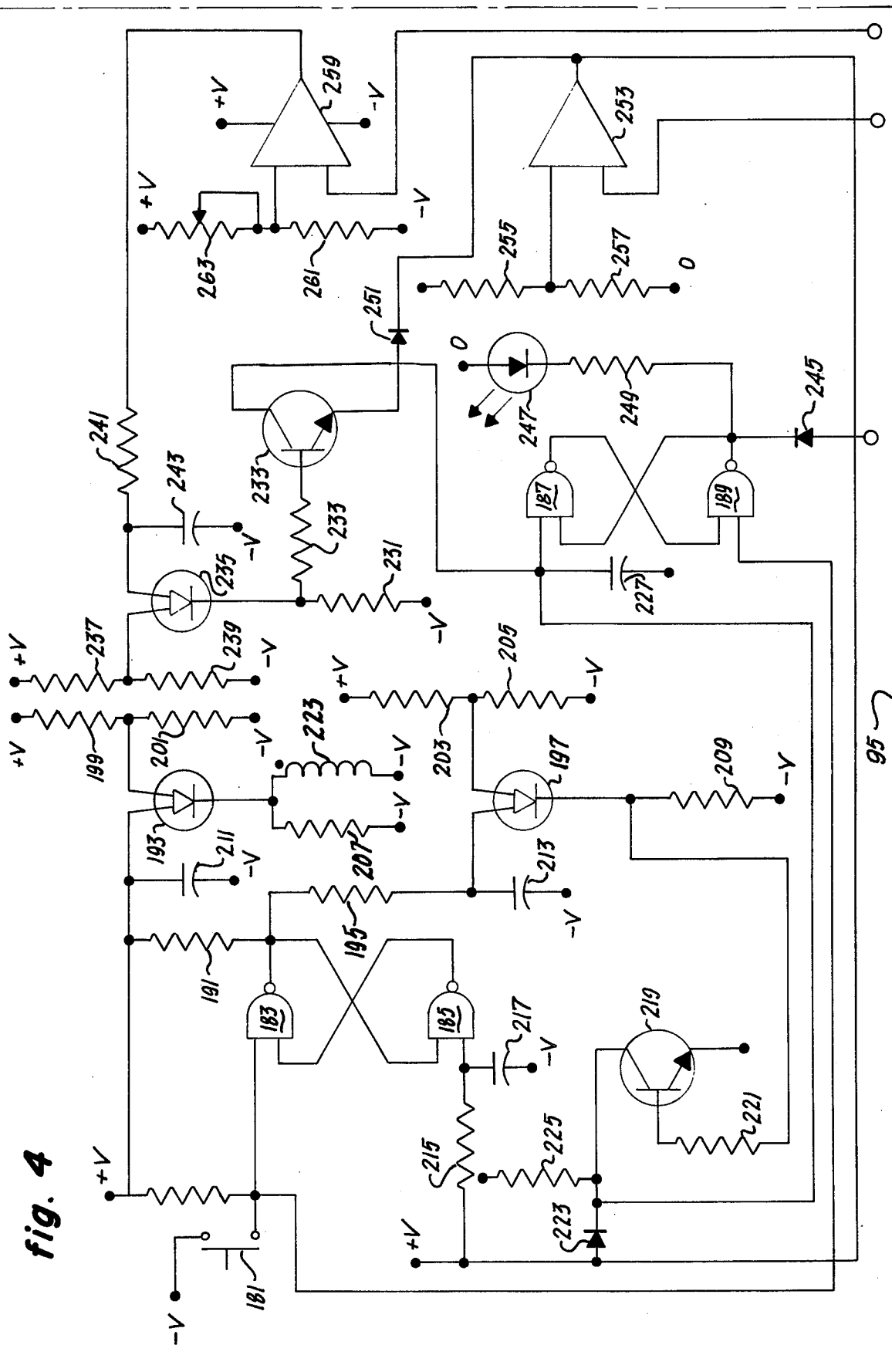
FIG. 4 is a schematic circuit diagram of a start circuit employed in the apparatus illustrated in FIG. 2.

Referring now to FIG. 4, the start circuit with over voltage control 95 is illustrated in detail. The start switch 181 applies a start potential to an amplifier 183. The amplifier 183 is a portion of a four-amplifier chip generally known in the art as a nand gate in which amplifiers lock and unlock in response to pulses. The other amplifiers in the nand gate in which the amplifier 183 is a part comprise the amplifiers 185, 187, and 189.

The output of the amplifier 183 is applied through a resistor 191 to a unijunction transistor 193 and through a resistor 195 to a unijunction transistor 197. Bias resistors 199 and 201 are provided for the unijunction transistor 193, and bias resistors 203 and 205 are provided for the unijunction transistor 197. A base resistor 207 is provided for the unijunction transistor 193, and a base resistor 209 is provided for the unijunction transistor 197. A filter capacitor 211 is provided for the unijunction transistor 193 and a timing capacitor 213 is provided for the unijunction transistor 197, as will be described. An input circuit for the amplifier 185 includes a resistor 215 and a capacitor 217.

The base of the unijunction transistor 197 is controlled by a transistor 219 having a base resistor 221, a collector diode 223, and a biasing resistor 225. The output of the unijunction transistor 193 is applied through the winding 223 of a pulse transformer located in the power drive circuit 75 (FIG. 2) for providing starting pulses to the lamp 11. Pulses of a sufficient magnitude create a breakdown pulse across the lamp for starting the lamp.

Closure of the start switch 181 also applies a potential to the input of the amplifier 189. The input of the amplifier 187 includes the diode 223, with a filtering capacitor 227 being provided. The amplifier 187 is controlled by a transistor 229 having base resistors 231 and 233 and controlled by a unijunction transistor 235. The unijunction transistor 235 is provided with bias resistors 237 and 239 and a timing circuit including a resistor 241 and timing capacitor 243. The timing circuit prevents premature tripping of the over voltage protection circuit, mentioned above, as a result of line transients or other aberrations.

The signal from the circuit 81 (FIG. 2) representative of lamp voltage is applied to the start circuit with over voltage control 95 at the comparator amplifier 259. The diode 245 is connected to the amplifier 189 and when the lamp voltage is too high, the amplifier 189 provides a signal from transistors 235 and 229 and the amplifiers 178 and 189 to the diode 245. This locks out the drive pulse which is applied to the power transistor drive circuit 77 (FIG. 2) as previously mentioned. In addition, a signal is applied to a replace lamp warning light 247 through a resistor 249.

The NPN transistor 229 has its emitter connected through a diode 251 to the output of an amplifier 253. The amplifier 253 is provided with power supply input resistors 255 and 257 and the signal representative of current produced by the current and voltage sensing amplifier circuit 81 (FIG. 2) is applied to the amplifier 253. A further amplifier 259 is provided having a bias resistor 261 and a potentiometer 263 for setting the gain thereof. The input to the amplifier 259 is provided by the signal representative of voltage produced by the current and voltage sensing amplifier circuit 81 (FIG. 2) and the output of the amplifier 259 is connected to the timing circuit comprising the resistor 241 and the capacitor 243.

In operation, depression of the start switch 181 causes the amplifier 183 and the unijunction transistor 193 to provide a series of pulses through the pulse transformer 223 dependent upon the timing resistor 213. Typically, the number of pulses may be eight and may provide a 13-KV pulse to the lamp. If the lamp starts, the current signal provided to the comparator amplifier 253 stops any further pulsing of the start circuit as previously described. If the lamp does not start by the time the capacitor 213 has discharged, the unijunction transistor 197 will trip, causing the transistor 219 to operate the amplifier 189 and cause the replace lamp light 247 to turn on.

When the voltage across the lamp 11 exceeds a preset limit, the power supply will be automatically shut off. This is accomplished by conducting the voltage signal which is representative of the lamp voltage from the circuit 81 (FIG. 2) to the amplifier 259. The potentiometer 263 is adjusted to set the desired trip level. This trip level may, for example, be between about 65 and 75 volts across the lamp. When the trip level is reached, the amplifier 259 provides an output signal through the unijunction transistor 235, the transistor 229, and the amplifier 187 to the diode 245. This provides a lock-out signal for turning off the drive circuit 77 (FIG. 2), resulting in the lamp being turned off. Simultaneously, the amplifier 189 lights the replace lamp 247.

Figure 5:
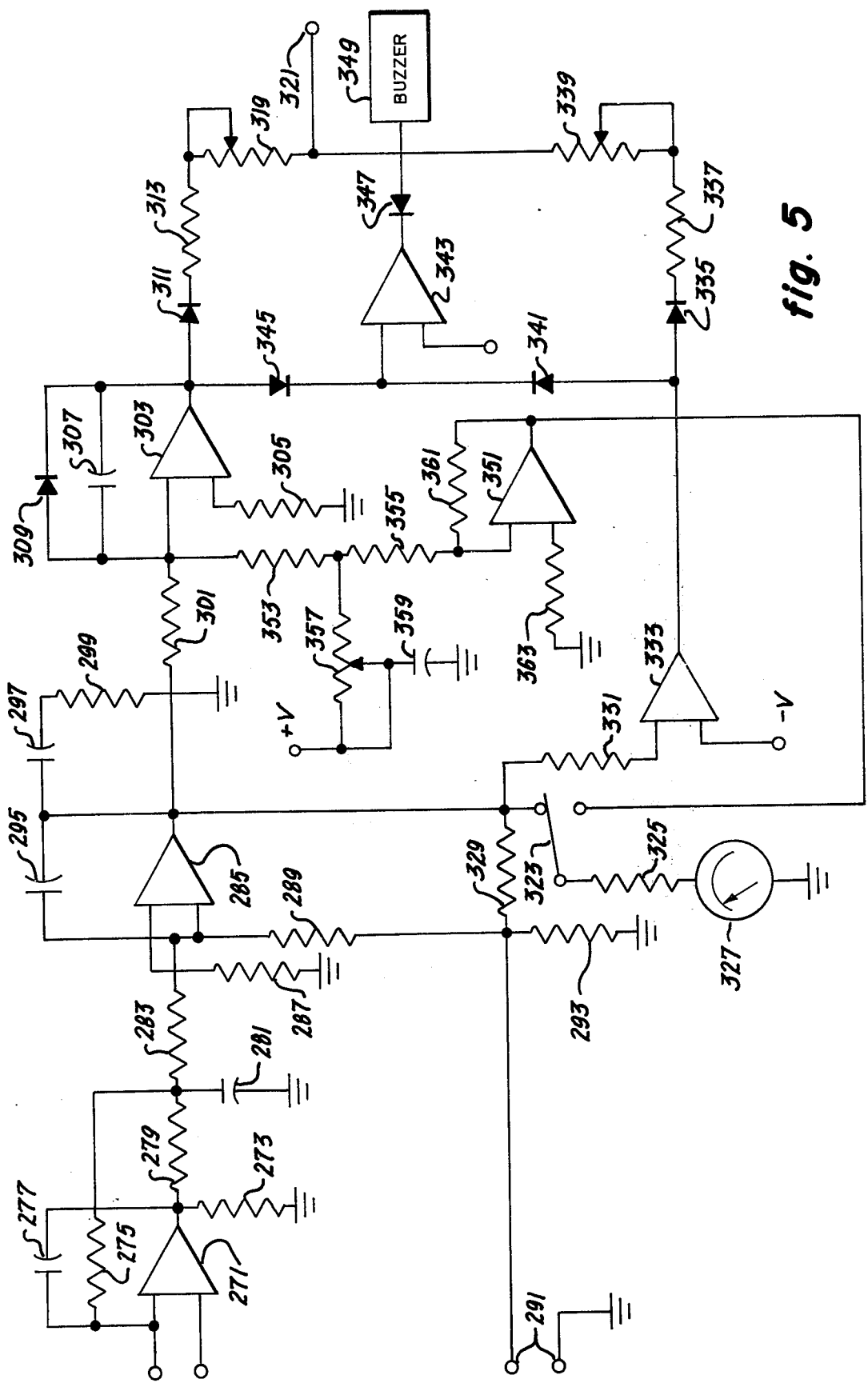
FIG. 5 is a schematic circuit diagram of the optical loop control system employed in the apparatus illustrated in FIG. 2.

Referring now to FIG. 5, the electrical aspects of the optical loop control system 103 may be seen in greater detail. The current signal provided by the light sensor is applied to the input terminals 270 of an amplifier 271 which provides an output signal across the resistor 273. A feedback resistor 275 and filter capacitor 277 are provided in association with the amplifier 271, and the output of the amplifier is applied through a series resistor 279 and filter capacitor 281 and a further series resistor 283 to an amplifier 285. The amplifier 285 is grounded through a resistor 287 and further input to the amplifier 285 is provided through a resistor 289 from input terminals 291 across which is derived a signal from a gain potentiometer, not illustrated, in the detector. This signal is developed across an input resistor 293. A capacitor 295 is connected across the amplifier 285 and a filter capacitor 297 and resistor 299 are also employed. The output of the amplifier 285 is applied through a series resistor 301 to an amplifier 303. The amplifier 303 has a grounding resistor 305, a parallel capacitor 307, and a parallel diode 309. The output of the amplifier 303 is applied through a diode 311 and series resistor 313 to a potentiometer 319 and an output terminal 321. The output terminal 321 is connected to the summing junction 89 in the main control summing amplifier 91 (FIG. 2).

The output of the amplifier 285 is applied through a switch 323 and series resistor 325 to a setting control and meter 327. An isolating resistor 329 is provided between the switch 323 and the input terminals 291. The output from the amplifier 285 is also applied through a series resistor 331 to a comparator amplifier 333. The amplifier 333, is its untripped mode, applies an output signal through a diode 335, a series resistor 337, and a potentiometer 339 to the output terminal 321. The output terminal 321 is connected to the summing junction 89 (FIGS. 2 and 3) to hold the lamp power at the idle level. The output of the amplifier 333 is also applied through a diode 341 to the input of an amplifier 343. The output of the amplifier 303 is also applied through a diode 345 to the input of the amplifier 343. The output of the amplifier is applied through a diode 347 to a buzzer system 349.

The output of the amplifier 285 applied through the series resistor 301 is also applied to an amplifier 351 through a pair of series resistors 353 and 355. A potentiometer tap 357 is connected between the resistors 353 and 355, and the tap of the potentiometer is connected through a capacitor 359 to ground and also to a source of positive voltage. A resistor 361 is connected across the amplifier 351, and a grounding resistor 363 is also provided for the amplifier.

In operation, the signal from the light sensing means 18, the gain of which may be controlled by a suitable potentiometer, not shown, is applied across the terminals 270. This current signal is amplified by the amplifier 271, which is a current-to-voltage amplifier the output of which is related to the light level. Additional gain control is provided by the second operational amplifier 285. By adjusting the unillustrated potentiometer in the sensing means 18, the system may be calibrated upon installation.

The signal from the amplifier 285 is compared to a reference signal provided by the setting of the potentiometer 327, which is located on the control panel (not shown) of the system. The potentiometer 327, in addition to providing the reference signal mentioned, provides a signal to the amplifier 351 upon momentary movement of the switch 323 (push button operated) to the terminal opposite the illustrated condition. Such momentary operation of the switch 323 causes the meter of the potentiometer 327 to display the level at which the system is set to operate.

When the switch 323 is in the normal or illustrated condition, the output of the amplifier 285 is displayed on the meter of the potentiometer 327. The system of the invention may be readily calibrated such that this displayed output is in terms of the light intensity in the exposure plane, e.g., mw/cm$^2$.

The output of the amplifier 285 is also applied to the amplifier 333 which operates as a comparator. A small range of variation (for example, 0.75 volts) in the signal applied will, with suitable component values, cause a relatively wide swing (for example, +6.7 volts to −5.4 volts) in the output of the amplifier 333 between positive and negative values. This signal is applied through the diode 335 to the resistor 337 and potentiometer 339, the latter being used to set the idle level of the lamp in the absence of an output from the amplifier 333. The signal at the terminal 321 is applied to the summing junction 89 (FIGS. 2 and 3) at which the signal inputs are balanced to provide the idle level output from the control amplifier 165 (FIG. 3).

When the idle level is too low upon shutter opening, an output occurs from the amplifier 285 which trips the comparator amplifier 333. The amplifier 333 then operates to remove the idle signal from the summing junction 89 (FIGS. 2 and 3) through the resistor 337 and potentiometer 339. This allows the system to increase power to the lamp (the upper limit being set by the potentiometer 169 (FIG. 3) and the sensed light level is sufficient to increase the output of the amplifier 285. This increases the output of the amplifier 303. Once the signal at the input to the amplifier 303 is balanced, the system stabilizes at the new level.

When the idle level is too high upon shutter opening, the signal from the amplifier 285 is greater than the signal from the potentiometer 327. This drives the amplifier 303, sending a signal through a diode 311, the resistor 313 and the potentiometer 319, to unbalance the summing junction 89 (FIGS. 2 and 3). This causes the system to reduce power to the lamp until a balance is reached at the output of the amplifier 285. The potentiometer 319 sets the gain of the optical loop 90 and sets the lower limit of lamp power.

Once the shutter closes, after an exposure has taken place, there is no output from the light sensing means 18. This causes the amplifier 333 to produce an output set by its bias source (e.g., +6.7 volts) and the lamp is then driven at the idle level determined by the setting of the potentiometer 339.

In the event the circuit of FIG. 5 is unable to achieve a balanced condition, either during idle or exposure periods, there will be a small positive voltage at the output of the amplifier 303. This voltage is set to be insufficient to trip the comparator amplifier 343. As a result, the amplifier 343 produces a negative signal output which operates the buzzer 349. This indicates the malfunction of the lamp to the operator.

It may be seen, therefore, that the invention provides an exposure system wherein, for a given power input, the light output may be varied over a wide range. Moreover, the light output is extremely uniform and noncoherent, avoiding many undesirable exposure defects. The exposure energy level and distribution may be easily optimized as can the extent of collimation or divergence/convergence of the light beam. The foregoing advantages result in substantially reduced operating costs and increased product yields.

Other advantages of the system of the invention result from the ability to provide controlled exposure level at all times, and in accordance with the spectral response of the particular photosensitive material which is being exposed. The system is readily calibrated to a desired light intensity and provides for optimizing lamp life. Lamp life is further prolonged by the starting technique employed in the system of the invention. Incorrect exposure conditions are indicated quickly to prevent incorrect processing, and over-voltage protection prevents lamp explosion and associated destruction of optical elements.

Various modifications of the invention will be apparent to those skilled in the art from the foregoing description and accompanying drawings. Such modifications are intended to fall within the scope of the appended claims.

What is claimed is:

1. An exposure system comprising a lamp, a power supply for driving said lamp at an idle level which optimizes the life of said lamp, means for driving light from said lamp through a light path to an exposure plane, exposure means for controlling the exposure period during which light at a preselected level from said lamp reaches the exposure plane, light detector means in the light path coordinated with said exposure means for detecting the light intensity from said lamp during the exposure period, and a control circuit connected to said power supply, said control circuit being responsive to said light detector for adjusting said power supply to provide the preselected level of light output from said lamp during the exposure period, said control circuit including means for reducing the power to said lamp below the idle level, means for increasing the power to said lamp above the idle level, and a summing circuit connected to said light detector for producing an output to cause a reduction or an increase in the power to said lamp.

2. A system according to claim 1 wherein said control circuit is adapted to respond to said light detector in less than about 10 milliseconds.

3. A system according to claim 1 wherein said control circuit is adapted to respond to said light detector in a time such that the light output of said lamp is at said preselected level for at least about 95 percent of the exposure period.

4. A system according to claim 1 wherein said directing means include mirrors at least one of which is adapted to pass a predetermined percentage of the light in the light beam therethrough, and wherein said light detector means is positioned behind said one mirror.

5. A system according to claim 1 wherein said light detector means include a light detector and filter means having a combined spectral response related to the spectral response of the material being exposed in the exposure plane.

6. A system according to claim 1 wherein said directing means include a lamp housing for supporting said lamp, reflector support means in said housing, and a plurality of reflectors mounted on said reflector support means, each oriented to direct the energy from said lamp with the apparent images superimposed on each other with different orientation in the exposure plane.

7. A system according to claim 6 including means for adjusting said reflector support means relative to said lamp.

8. A system according to claim 1 including a starting circuit for applying a predetermined number of direct current starting pulses to said lamp, said starting circuit including means for indicating when said lamp has failed to start after a predetermined number of pulses.

9. A system according to claim 1 wherein said exposure means comprises a shutter in the light path for controlling the exposure period during which light from said lamp reaches the exposure plane, and wherein said light detector means is positioned in the light path on the opposite side of said shutter from said lamp.

* * * * *

UNITED STATES PATENT AND TRADEMARK OFFICE
CERTIFICATE OF CORRECTION

PATENT NO. : 4,024,428
DATED : MAY 17, 1977
INVENTOR(S) : GERALD BACHUR and GEORGE E. RICHARDSON It is certified that error appears in the above-identified patent and that said Letters Patent are hereby corrected as shown below:

Column 8, line 56, change "178" to ---187---

Column 11, line 57, Claim 1, change "driving" to ---directing---

Column 12, line 53, Claim 9, change "comprises" to ---comprise---

Signed and Sealed this

Eighteenth Day of April 1978

[SEAL]

Attest:

RUTH C. MASON
Attesting Officer

LUTRELLE F. PARKER
Acting Commissioner of Patents and Trademarks